United States Patent [19]
Depetro et al.

[11] Patent Number: 5,912,495
[45] Date of Patent: Jun. 15, 1999

[54] HIGH VOLTAGE DRIVER CIRCUIT WITH DIODE

[75] Inventors: Riccardo Depetro, Domodossola; Aldo Novelli, San Lorenzo Di Parabiago, both of Italy

[73] Assignee: SGS-Thomson Microelectronics, S.r.l., Agrate Brianza, Italy

[21] Appl. No.: 08/690,060

[22] Filed: Jul. 31, 1996

[30]     Foreign Application Priority Data

Jul. 31, 1995   [EP]   European Pat. Off. ............. 95830346

[51] Int. Cl.$^6$ ................................................... H01L 23/62
[52] U.S. Cl. .................. 257/355; 257/362; 257/500; 257/531; 257/539; 257/547; 257/577; 257/546
[58] Field of Search ...................... 257/355, 500, 257/577, 531, 539, 582, 603, 547, 544, 546, 550, 570, 551, 362

[56]          References Cited

U.S. PATENT DOCUMENTS

| | | | |
|---|---|---|---|
| 4,054,828 | 10/1977 | Conzelmann et al. | 322/28 |
| 4,250,829 | 2/1981 | Stephens, Jr. | 440/1 |
| 4,496,849 | 1/1985 | Kotowski | 307/254 |
| 4,847,603 | 7/1989 | Blanchard | 340/705 |
| 4,882,532 | 11/1989 | Gariboldi et al. | 323/222 |
| 4,928,157 | 5/1990 | Matsunaga et al. | 357/23.13 |
| 5,347,419 | 9/1994 | Caron et al. | 361/154 |
| 5,397,914 | 3/1995 | Suda et al. | 257/570 |
| 5,495,123 | 2/1996 | Canclini | 257/500 |
| 5,751,052 | 5/1998 | Heminger et al. | 257/577 |

FOREIGN PATENT DOCUMENTS

| | | |
|---|---|---|
| 0 261 556 | 3/1988 | European Pat. Off. . |
| 0 588 067 | 3/1994 | European Pat. Off. . |
| 0 624 906 | 11/1994 | European Pat. Off. . |

*Primary Examiner*—William Mintel
*Attorney, Agent, or Firm*—David V. Carlson; Seed and Berry LLP

[57]           ABSTRACT

The invention relates to a structure for and the method of manufacturing a driver circuit for an inductive load monolithically integrated on a semiconductor substrate doped with a first type of doping agent and on which is grown an epitaxial well having a second type of doping agent. An insulated well doped with the same type of doping agent as the substrate, which houses at least one power transistor of the driver circuit, is provided within the epitaxial well. The epitaxial well also houses a first and a second active area which house the cathode terminal and anode terminal of a protection diode, respectively.

19 Claims, 4 Drawing Sheets

HIGH VOLTAGE DRIVER CIRCUIT WITH DIODE

TECHNICAL FIELD

This invention relates to a high voltage driver circuit protected against polarity reversals, in particular, for inductive loads.

BACKGROUND OF THE INVENTION

As is well known, continuous innovation in the manufacturing technology of semiconductor integrated circuits has made it possible to achieve levels of integration which reduce the semiconductor area occupied by each individual circuit to a minimum, thus increasing the number of circuits which can be integrated on a single chip. One of the limiting factors for the application of such reduced levels of integration is that the circuits obtained in this way are only able to operate with low levels of current and voltage. These circuits cannot therefore be directly interfaced with power systems or load devices operating with high levels of voltage or current.

In the last few years a technology similar to reduced scale integration has been developed which is capable of obtaining integrated power circuits of reduced size, but operating with high levels of current and voltage. The devices obtained by this technology are known as Integrated Power Circuits (IPC). Integrated Power Circuits are currently used in any machine or device which requires a power supply which is different from the primary power supply and in which a high level of voltage, current and/or output power control is desired.

A particular category of IPC circuits known as High Voltage Integrated Circuits or HVIC includes interfaces with high voltage and relatively low current which are capable of connecting, for example, logic circuits and discrete high power devices.

Integrated circuits, and in particular high voltage transistors, can be realized using IPC technology with vertical or lateral structures. Vertical integration of high voltage transistors and of the corresponding driver circuitry however requires thick epitaxial layers or multiple layers, as well as complicated and expensive insulating dielectrics. Lateral integration of power devices is generally preferred, as this only requires a thin epitaxial layer of approximately 5–10 μm thick, and this is therefore more compatible with the manufacturing processes of low voltage circuits.

In addition to this, in all applications in which inductive loads have to be controlled it is of fundamental importance to be able to limit if not in fact eliminate parasitic transistors which might originate in the vicinity of layers having the opposite type of doping.

FIG. 1 diagrammatically illustrates a prior art circuit architecture 1 which includes a driver circuit 2 inserted between a first supply reference voltage Vcc and a second reference voltage, for example, a ground GND, and connected to an inductive load L which is in turn connected to ground GND.

In order to simplify the description, driver circuit 2 in FIG. 1 will be illustrated with only two components, specifically a power transistor T1 and a bias transistor T2, cascade inserted between the supply reference voltage Vcc and the ground GND, and having control terminals B1 and B2, respectively. Transistors T1 and T2 may be of the IGBT type. Terminals B1 and B2 are connected to a circuit portion which is not shown in FIG. 1 as it is not pertinent to the operating of architecture 1.

FIG. 2 shows a cross-sectional view of the power transistor T2 in driver circuit 2. The structure includes a substrate 3 of the P⁻ type on which are provided a deep layer 4 of the N⁺ type and an epitaxial layer 5.

Within the epitaxial layer 5 a first diffusion zone 6 of the N⁻ type and a second diffusion zone 7 of the P⁺ type, together with a third diffusion zone 8 of the N⁺ type located on the deep layer 4, are obtained by implantation and subsequent diffusion of the doping agent. Diffusion zone 6 includes collector terminal C1 for power transistor T2 of the driver circuit 2 and is therefore directly connected to the inductive load L.

As the current recycles within the inductive load, the potential of collector C1 is force carried to a value less than the potential of ground GND. In this way a parasitic transistor P, of which an electrical diagram is indicated superimposed as dashed lines on the section of the integrated circuit shown in FIG. 2, is thus turned on. This parasitic transistor P has an emitter terminal Ep which coincides with the third diffusion zone 8, and a collector terminal Cp which coincides with the first diffusion zone 6, and a control or base terminal Bp which coincides with the substrate 3 of the integrated circuit. Parasitic transistor P is therefore a lateral transistor of the NPN type.

The current gain in this transistor may vary according to the arrangement and the area of the diffusion wells in the device. The presence of this parasitic transistor generally interferes with correct operation of the integrated circuit. This becomes a very serious problem for applications with high supply voltages, i.e., values in excess of 500 V.

A known technical solution for eliminating this parasitic transistor is illustrated in FIG. 3. In addition to power transistor T2, FIG. 3 shows other diffusion zones 7' and 8', as well as a deep region 4', realized within the epitaxial layer 5, which include components of the integrated circuit adjacent to power transistor T1.

The known solution provides for the use of a structure 9, a so-called barrier structure, placed between the area in which power transistor T1 is formed and the areas which include the adjacent circuits. Barrier 9 collects most of the current provided by emitter terminal Ep of parasitic transistor P.

Although fulfilling its object, this solution needs an appreciable area of integrated circuit for its implementation, thus countering the efforts made to obtain a high integration density for power devices too.

Other known solutions are obtained using a thin epitaxial technique, which presents problems with the integration of structures which are operating at high voltage levels and are at the same time safe as regards polarity reversals. In thin epitaxial technology it is not in fact possible to obtain integrated structures with a low loss toward the substrate.

SUMMARY OF THE INVENTION

The concept underlying this invention is to provide an integrated structure comprising a LDMOS transistor capable of withstanding high voltage levels, and a PN diode protecting the circuit against polarity reversal, provided in a single epitaxial well which also includes the bonding terminal. The technical solution underlying this invention is to provide an integrated structure for a driver circuit which is capable of withstanding high voltage levels and ensuring correct operation in the presence of polarity reversals, in such a way as to overcome the limitations which nevertheless affect integrated circuits realized in accordance with the known art.

More specifically, the invention relates to a driver circuit for an inductive load which is monolithically integrated on a semiconductor substrate doped with a first type of doping agent and on which an insulating layer is deposited and on which is grown an epitaxial well having a second type of doping agent in which a further well is provided housing at least one power transistor (M1) for the driver circuit.

The invention also relates to a manufacturing process of a high voltage driver circuit integrated on a semiconductor substrate having a first type of doping agent and of the type comprising at least one power transistor provided in an epitaxial well provided on the substrate with a second type of doping agent and separated from the substrate by means of an insulating layer. The transistor obtains active areas during the implantation and corresponding diffusion phases of both types of doping agent.

The features and advantages of the integrated structure according to the invention will be apparent from the following description of an embodiment given by way of a non-restrictive example with reference to the enclosed drawings.

DETAILED DESCRIPTION OF THE INVENTION

Figure 4:
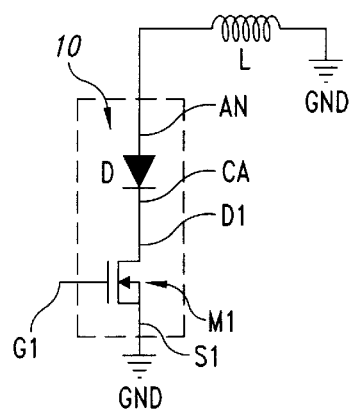
FIG. 4 shows diagrammatically a high voltage driver circuit for an inductive load protected against polarity reversal according to the invention.

With reference to FIG. 4, a driver circuit 10 for an inductive load L manufactured according to the invention is illustrated.

Driver circuit 10 includes a transistor M1 of the LDMOS type and a diode D of the PN type, together cascade inserted between inductive load L and a reference voltage, for example, a ground GND.

FIGS. 5A–5D show diagrammatical views in vertical cross-section of the integrated structure CI incorporating driver circuit 10 according to the process of the invention. These figures do not show inductive load L, which is outside the driver circuit.

Figure 5D:
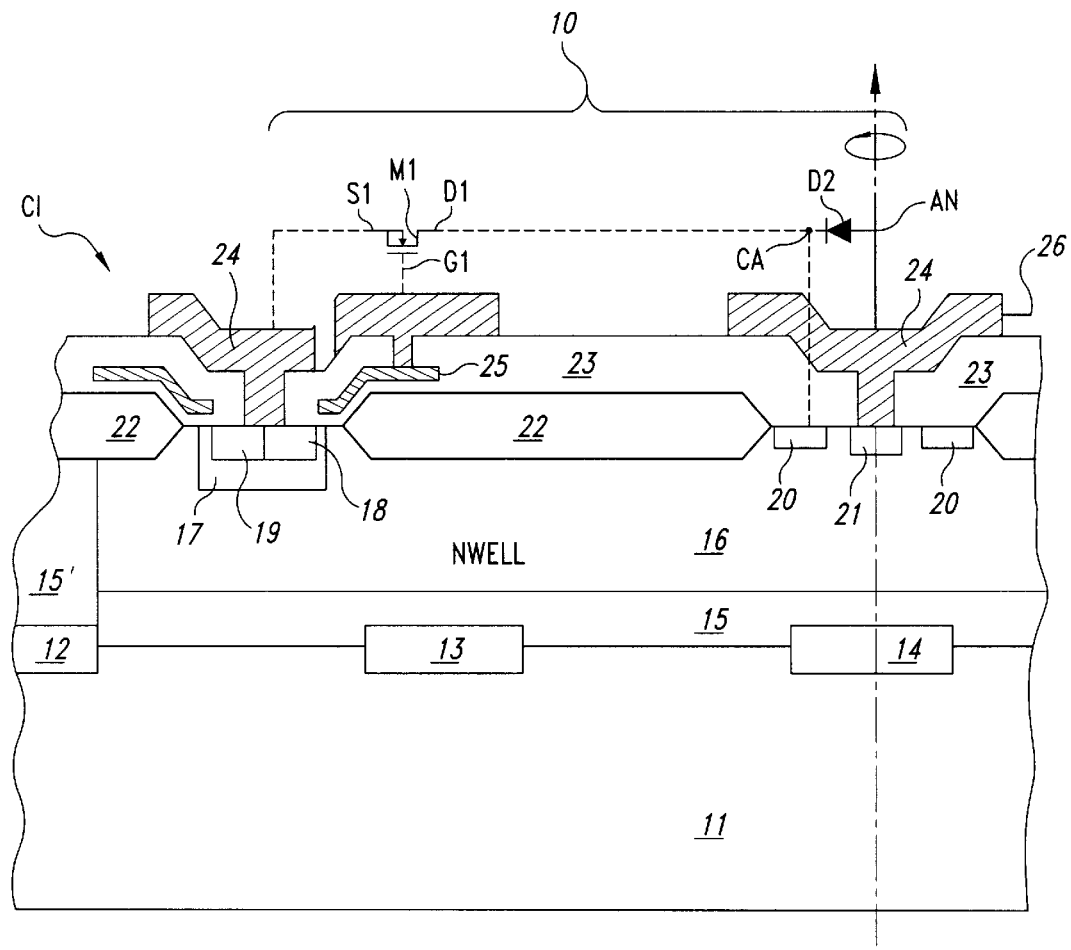
FIGS. 5A–5D show vertical cross-sectional views illustrating the process of manufacturing the invention of FIG. 4.
Figure 5A:
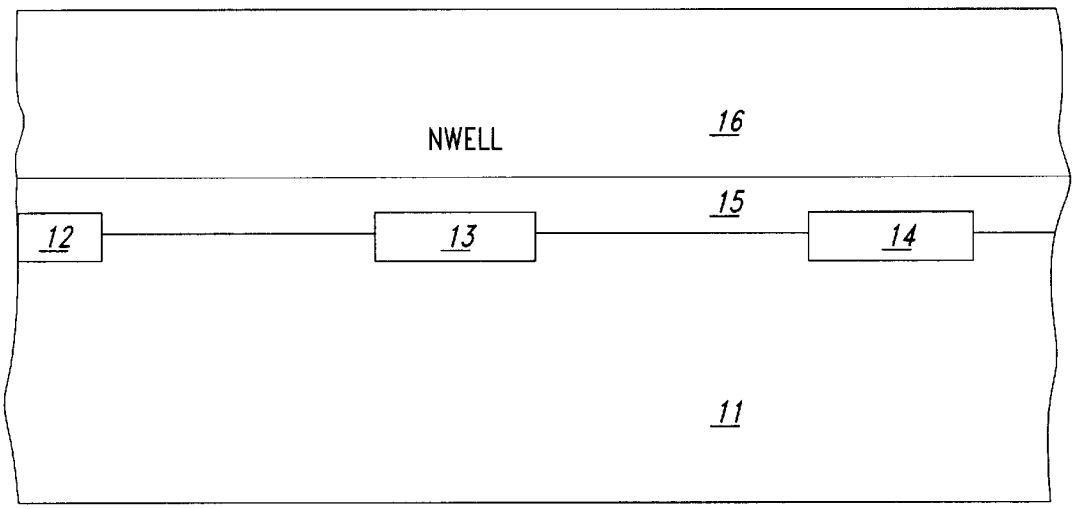

In accordance with FIG. 5A, a semiconductor substrate 11 having a reduced concentration of a first type of doping agent, for example, of P type is provided. A first implantation phase forms a first deep region 12 and a second deep region 13 of low concentration of the first type of doping agent using a single mask. In one example of forming deep regions 12, 13, an implantation energy of 100–150 keV at a dose in the range of $10^{12}$–$10^{13}$ cm$^{-2}$ is used. A second implantation phase having an implant energy of 100–150 KeV forms a third deep region 14 of a second type of doping agent, for example, of type N. In one example, third deep region 14 is implanted at a dose in the range of $10^{15}$–$10^{16}$ cm$^{-2}$ and is formed subsequent to the production of regions 12 and 13 using a different mask.

An epitaxial layer 15 of approximately 5 μm–15 μm thick is grown over the substrate 11 and deep regions 12, 13, 14, and lightly doped P-type to a dopant concentration in the range of $10^{14}$–$10^{15}$ cm$^{-3}$ through implantation. Next, well region 16 is formed within the epitaxial layer 15 by a blanket implantation of an N-type dopant at a dose concentration in the range of $9\times10^{11}$–$2\times10^{12}$ cm$^{-2}$ and energy of 100–180 KeV.

Figure 5B:
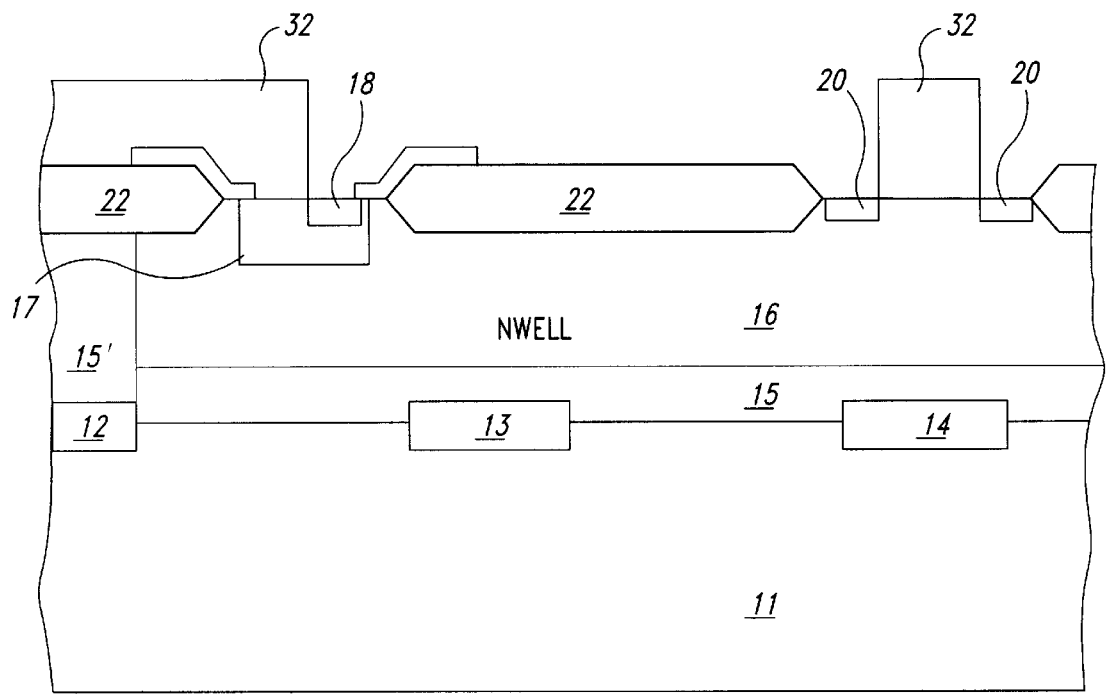

As shown in FIG. 5B, upper isolation regions 15' are provided above deep region 12 to better laterally isolate the N-type well 16 in the epitaxial layer. Isolation regions 15' are P-type deep well regions implanted at a dose concentration in the range of $5\times10^{14}$–$2\times10^{16}$ cm$^{-2}$ at an energy of 90–15 KeV. A subsequent oxidation phase using a standard LOCOS process and selectively patterned nitride mask makes it possible to obtain field oxide regions 22 defining active areas within the epitaxial layer 16. Above epitaxial well 16 an implantation and subsequent diffusion phase of the first type of doping agent is performed, forming a P-body well 17 within epitaxial well 16. The P-body well 17 is implanted at 50–200 KeV at a dose in the range of $10^{13}$–$10^{14}$ cm$^{-2}$. Subsequent thermal diffusion steps define the amount of the doping agents in P-body well 17 and the deep regions 12, 13, 14 within the epitaxial layer 15.

A mask 32 is formed and patterned as shown in FIG. 5B. Next, p-body well 17 receives further implantation and diffusion phases to form a first active region 18. Regions 17 and 18 are formed using separate masks. A mask 32 is formed and patterned by any suitable technique. A third active region 20 is also formed within epitaxial well 16 along with during the implantation and diffusion phase of the N$^+$ doping agent first active region 18, shown in FIG. 5B.

Figure 5C:
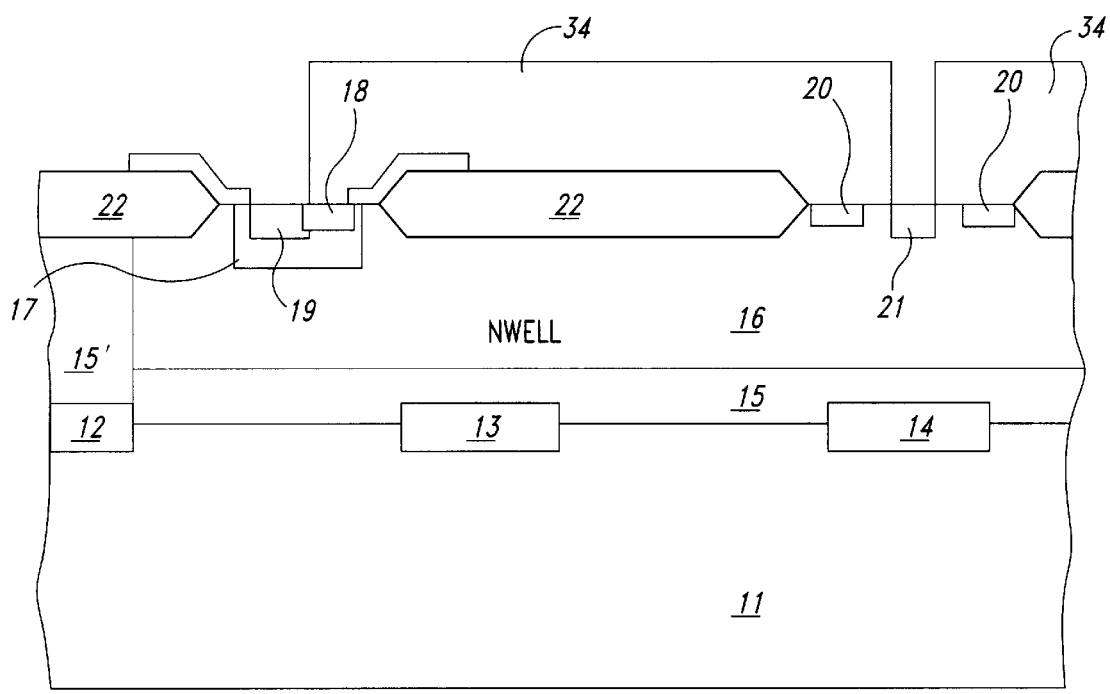

A subsequent second active region 19 of a high concentration is then formed as shown in FIG. 5C. Mask 32 is removed and mask 34 is formed and patterned. First active region 18 has a second N$^+$ type dopant concentration while the second active region 19 has a first P$^+$ type dopant concentration.

A further fourth active region 21 is also formed, again within epitaxial well 16, along with the implantation and diffusion phase of the second active region 19, shown in FIG. 5C. Regions 18–21 are implanted at an energy of 20–100 KeV at a dose in the range of $10^{15}$–$10^{16}$ cm$^{-2}$. Regions 18 and 20 are formed using a single mask 32 and regions 19 and 21 are formed together using a different, single mask 34. In the preferred embodiment regions 18 and 20 are doped with arsenic and regions 17, 19, and 21 are doped with boron. Arsenic and boron may have different diffusion rates which may cause regions 19 and 21 to be deeper than regions 18 and 20. However, depending on the dopant used, such as phosphorus instead of arsenic, or the use of different implant energies, the regions 19 and 21 may be the same depth as, or be more shallow than, regions 18 and 20, as shown in FIG. 5D.

With reference to FIG. 5D, the final structure is shown after all process steps. A thin layer of oxide is grown on the surface of the epitaxial well 16. Above the thin oxide layer a layer 25 of suitably doped polysilicon is deposited to form the gate terminal G1 for LDMOS transistor M1. At this point a second oxide layer 23 is deposited using a mask which keeps part of first active region 18 and second active region 19 and fourth active region 21 free from oxide.

The manufacturing process is completed by a definition and metallisation phase of the contact areas 24 for gate G1 and source S1 of transistor M1, of the anode terminal AN of diode D and of the bonding terminal 26.

Advantageously, and in accordance with the invention, drain terminal D1 of transistor M1 coincides with the cathode terminal CA of diode D, i.e., with active region 20 contained within epitaxial well 16.

Figure 1:
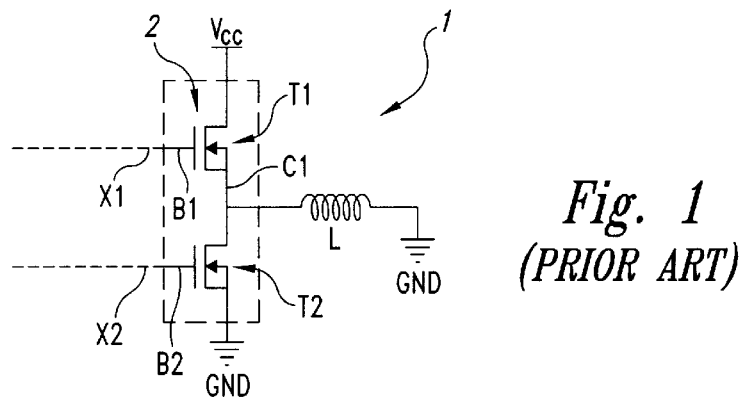
FIG. 1 shows diagrammatically a driver circuit for an inductive load according to known prior art.
Figure 2:
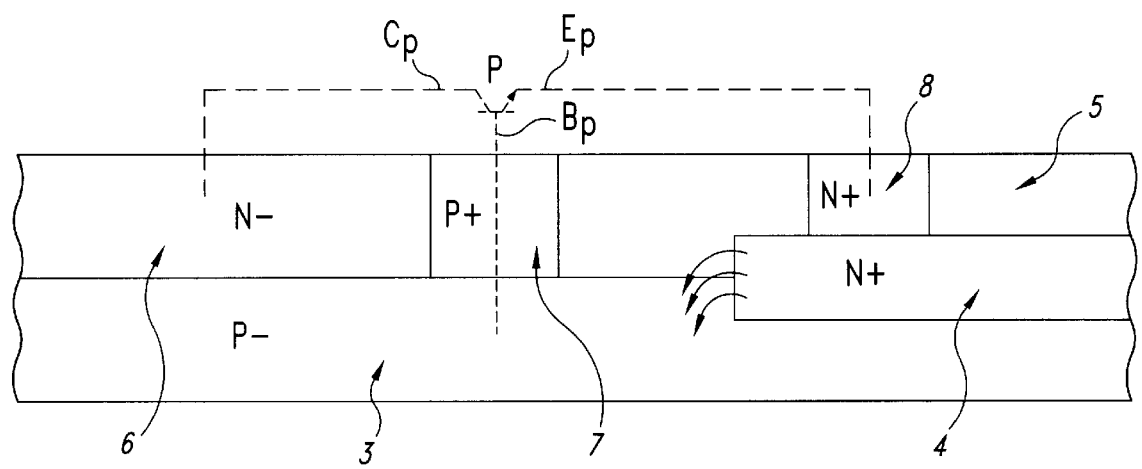
FIG. 2 shows a diagrammatical view in vertical cross-section of a semiconductor on which driver circuit manufactured in accordance with the known prior art of FIG. 1 is integrated.
Figure 3:
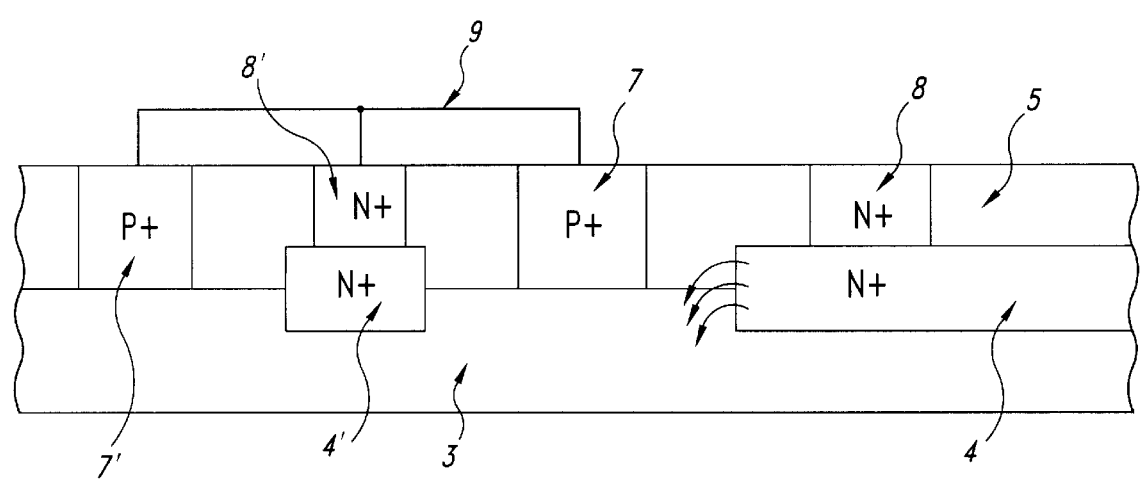
FIG. 3 shows a diagrammatical view in vertical cross-section of a semiconductor on which a driver circuit with a device for reducing the effects of parasitic transistors manufactured in accordance with the known prior art is incorporated.

The anode terminal AN of diode D is accessible to the user. This makes it possible to limit the turning on of NPN parasitic transistor P already illustrated with reference to the known art, and in particular in FIG. 2, up to the maximum reverse voltage of diode D, typically a value of 9 V.

Advantageously, and in accordance with the invention, this anode terminal AN is connected directly to the contact pin with a reference voltage for the integrated circuit. In this way the high voltage metallisation is prevented from passing over upper isolation zone 15', which is connected to ground.

The structure illustrated in FIG. 5D provides a PNP transistor 21, 16, 17, an NPN transistor 18, 17, 16, and a diode 21, 16 within a single well 16. Fundamentally, region 14 reduces the PNP transistor 21, 16, 17 gain and effectively is a barrier versus carrier injection in the substrate or to the p-body region 17 respective of PNP transistor 21, 16, 17. Region 13 is mainly integrated to allow the structure to be suitable for high voltage operation because above that region the depletion region associated with junction 13, 15 reach the surface at a relatively low voltage, avoiding high electric field formation at the field oxide beak edge. This is very important to reach RESURF condition (REduction OF SURface Field) without having premature breakdown. The combined gain of PNP and NPN is such to prevent latch-up.

It should also be noted that the integrated structures shown in FIG. 5D comprise a buried region 14 which avoids the phenomenon of anode terminal AN of diode D punching through substrate 11 and at the same time minimizes the injection of carriers in substrate 11 when anode AN itself is directly biased, i.e., in the normal operating condition of LDMOS transistor M1.

The operation of transistor M1 may be compared to that of a lateral LIGBT transistor. In reality, the integrated structure according to the invention makes use of the special features of the diode-transistor connection in reverse biasing, while the IGBT transistors base their operation on the capacity of the diode to carry current in the zone of direct biasing. For this reason the size of driver circuit 10 differs from that of an LIGBT transistor. In particular, buried zone 14 is enriched in such a way as to reduce the efficiency and gain of the PNP parasitic transistor constituted by the P-type anode AN of diode D (diffusion zone 21), epitaxial N-type layer 16 and the P-type substrate 11.

In summary, the integrated CI structure according to the invention makes it possible to eliminate the problems associated with the presence of parasitic elements and polarity reversal, overcoming the disadvantages of circuits realized in accordance with the prior art. While various embodiments have been described in this application for illustrative purposes, the claims are not so limited. Rather, any equivalent method or device operating according to principles of the invention falls within the scope thereof.

We claim:

1. A driver circuit, for an inductive load, monolithically integrated on a semiconductor substrate doped with a first type of doping agent and on which is grown an epitaxial well, bounded by insulating regions, which has a second type of doping agent and in which is provided a further well housing at least one power transistor of the driver circuit, characterised in that said epitaxial well also houses a first and a second active region which house respectively the cathode terminal and the anode terminal of a protection diode connected to said transistor and which is provided with a buried region between the substrate and the epitaxial well in proximity of said active regions.

2. The driver circuit of claim 1 wherein that said first active region also houses the drain terminal of the power transistor.

3. The driver circuit of claim 1 wherein said buried region is doped with the second type of doping agent.

4. The driver circuit of claim 3 wherein said buried region has a greater amount of the second type of doping agent in comparison with the epitaxial well.

5. A driver circuit for an inductive load, comprising:
a semiconductor layer;
a well disposed within the semiconductor layer;
a diode disposed within the well, the diode having an anode and a cathode, the anode being coupled to the load, the diode operable to limit the turning on of a parasitic transistor; and
a transistor disposed in the well, the transistor coupled between the diode and a reference voltage, the transistor operable to receive a control signal, and to couple the load to the reference voltage through the diode responsive to the control signal having a first state.

6. The driver circuit of claim 5, further comprising:
a buried region disposed in the semiconductor layer in the approximate vicinity of the diode, the buried region operable to be a barrier to carrier injection in the semiconductor layer or to the well.

7. The driver circuit of claim 6 wherein the buried region includes a doped semiconductor material.

8. The driver circuit of claim 5 wherein the semiconductor layer includes an epitaxial layer overlaying a substrate.

9. The driver circuit of claim 5 wherein the reference voltage is ground.

10. The driver circuit of claim 5 wherein the transistor has a gate, a source, and a drain, the drain being coupled to the cathode of the diode, the source operable to be coupled to the reference voltage, and the gate operable to receive the control signal.

11. A driver circuit for an inductive load, comprising:
a substrate;
an epitaxial layer disposed over the substrate;
a first well disposed within the epitaxial layer;
a second well disposed within the first well;
a first active region disposed within the first well;
a second active region disposed within the first well;
a diode having an anode and a cathode, the cathode disposed in the first active region, and the anode disposed in the second active region, the diode being coupled to the load, the diode operable to limit the turning on of a parasitic transistor;
a transistor disposed at least in part within the second well, the transistor having a gate, a source, and a drain, the transistor operable to be coupled between a reference voltage and the diode, the transistor operable to receive a control signal and to couple the diode to the reference voltage responsive to the control signal; and
a buried region disposed adjacent the locations where the substrate and the epitaxial layer meet, the buried region being disposed in the proximity of the first and second active regions.

12. The driver circuit of claim 11 wherein the first active region comprises a semiconductor material doped with a relatively high concentration of a first type of doping agent and the second active region comprises a semiconductor material doped with a relatively high concentration of a second type of doping agent.

13. The driver circuit of claim 12 wherein the first type of doping agent comprises an N-type doping agent, and the second type of doping agent comprises a P-type doping agent.

14. The driver circuit of claim 11 wherein the source of the transistor is operable to be coupled to the reference voltage, the drain is coupled to the cathode of the diode, and the gate is operable to receive the control signal.

15. The driver circuit of claim 11 wherein the cathode of the diode is coupled to the drain of the transistor and the anode is operable to be coupled to the load.

16. The driver circuit of claim 11 wherein the drain of the transistor is disposed within the first active region.

17. The driver circuit of claim 11 wherein the reference voltage comprises ground.

18. The driver circuit of claim 11, further comprising:

a third well disposed on the substrate, the third well being approximately adjacent to the first well; and an insulating region disposed between the first well and the third well, the insulating region electrically insulating the first well from the third well.

19. The driver circuit of claim 11 wherein the substrate comprises a semiconductor material doped with a first type of doping agent, the first well comprises a semiconductor material doped with a second type of doping agent, and the buried region comprises a semiconductor material doped with the second type of doping agent, the buried region having a greater amount of the second doping material than the first well.

* * * * *